United States Patent [19]

Streetman et al.

[11] Patent Number: 5,080,870
[45] Date of Patent: Jan. 14, 1992

[54] SUBLIMATING AND CRACKING APPARATUS

[75] Inventors: Ben G. Streetman, Austin; Terry J. Mattord, Red Rock; Dean P. Neikirk, Austin, all of Tex.

[73] Assignee: Board of Regents, The University of Texas System, Austin, Tex.

[21] Appl. No.: 400,241

[22] Filed: Aug. 28, 1989

Related U.S. Application Data

[63] Continuation-in-part of Ser. No. 241,578, Sep. 8, 1988.

[51] Int. Cl.$^5$ .............................................. B01J 19/00
[52] U.S. Cl. .................................... 422/129; 118/715; 118/724; 118/726; 148/DIG. 6; 148/DIG. 169; 156/610; 156/611; 156/613; 156/103; 422/164; 422/167; 422/199; 422/245; 422/248; 437/105; 437/106; 437/107; 437/930
[58] Field of Search ............... 422/129, 164, 167, 199, 422/245, 248; 118/715, 724, 726; 437/930, 105, 106, 107; 148/DIG. 6, DIG. 169; 156/610, 611, 613, DIG. 130; 251/205

[56] References Cited

U.S. PATENT DOCUMENTS

| | | | |
|---|---|---|---|
| 2,069,309 | 2/1937 | Henszey | 251/205 |
| 2,440,135 | 4/1948 | Alexander . | |
| 2,793,609 | 5/1957 | Tzu En Shen et al. . | |
| 3,153,137 | 10/1964 | Drumheller . | |
| 3,434,894 | 3/1969 | Gale | 437/930 |
| 3,547,074 | 12/1970 | Hirschfeld | 148/DIG. 169 |
| 3,662,154 | 5/1972 | Harra . | |
| 3,916,034 | 10/1975 | Tsuchimoto | 148/DIG. 169 |
| 3,974,002 | 8/1976 | Casey, Jr. et al. . | |
| 4,137,865 | 2/1979 | Cho . | |
| 4,179,312 | 12/1979 | Keller et al. | 156/DIG. 103 |
| 4,181,544 | 1/1980 | Cho . | |
| 4,239,955 | 12/1980 | Cho . | |
| 4,286,545 | 9/1981 | Takagi et al. | 148/DIG. 169 |
| 4,385,946 | 5/1983 | Finegan et al. . | |
| 4,392,453 | 7/1983 | Luscher . | |
| 4,426,569 | 1/1984 | Miller et al. . | |
| 4,518,846 | 5/1985 | Freeouf et al. . | |
| 4,543,467 | 9/1985 | Eisele et al. . | |
| 4,553,022 | 11/1985 | Colombo . | |
| 4,607,152 | 8/1986 | Allovon et al. . | |
| 4,646,680 | 3/1987 | Maki . | |
| 4,648,347 | 3/1987 | Aichert et al. . | |
| 4,699,083 | 10/1987 | Huet et al. . | |
| 4,748,315 | 5/1988 | Takahashi et al. . | |
| 4,777,022 | 10/1988 | Boldish et al. . | |

OTHER PUBLICATIONS

EPI System Brochure for Model 175 Cracking Effusion Cell.
Garcia et al., "Dimer Arsenic Source Using A High Efficiency Catalytic Cracking Oven For Molecular Beam Epitaxy", Apply. Phys. Lett., vol. 51, No. 8, pp. 593-595, dated 8/24/87.
Calawa, "On the Use Of AsH$_3$ in the Molecular Beam Epitaxial Growth of GaAs", Appl. Phys. Lett, vol. 38, No. 9, pp. 701-703, dated 5/1/81.
EPI Systems' "Dual Filament Effusion Cells".
EPI Product Guide.
Miller et al., "J. Vac. Sci. Technol.", B8(2), Mar., Apr. 1990.

Primary Examiner—Robert J. Warden
Assistant Examiner—Timothy M. McMahon
Attorney, Agent, or Firm—Arnold, White & Durkee

[57] ABSTRACT

A furnace having a sublimating section, a cracking section oriented off axis to the sublimating section, and a valve for controlling flux between the sections. The valve includes an annular plug having at least one longitudinal slot. The plug is retractable from a fully closed position where the slot is completely covered, to a fully open position where the slot is completely exposed. The slot becomes increasingly exposed as the plug is moved from the fully closed position to the fully opened position, thereby increasing flux from the sublimating section to the cracking section.

7 Claims, 5 Drawing Sheets

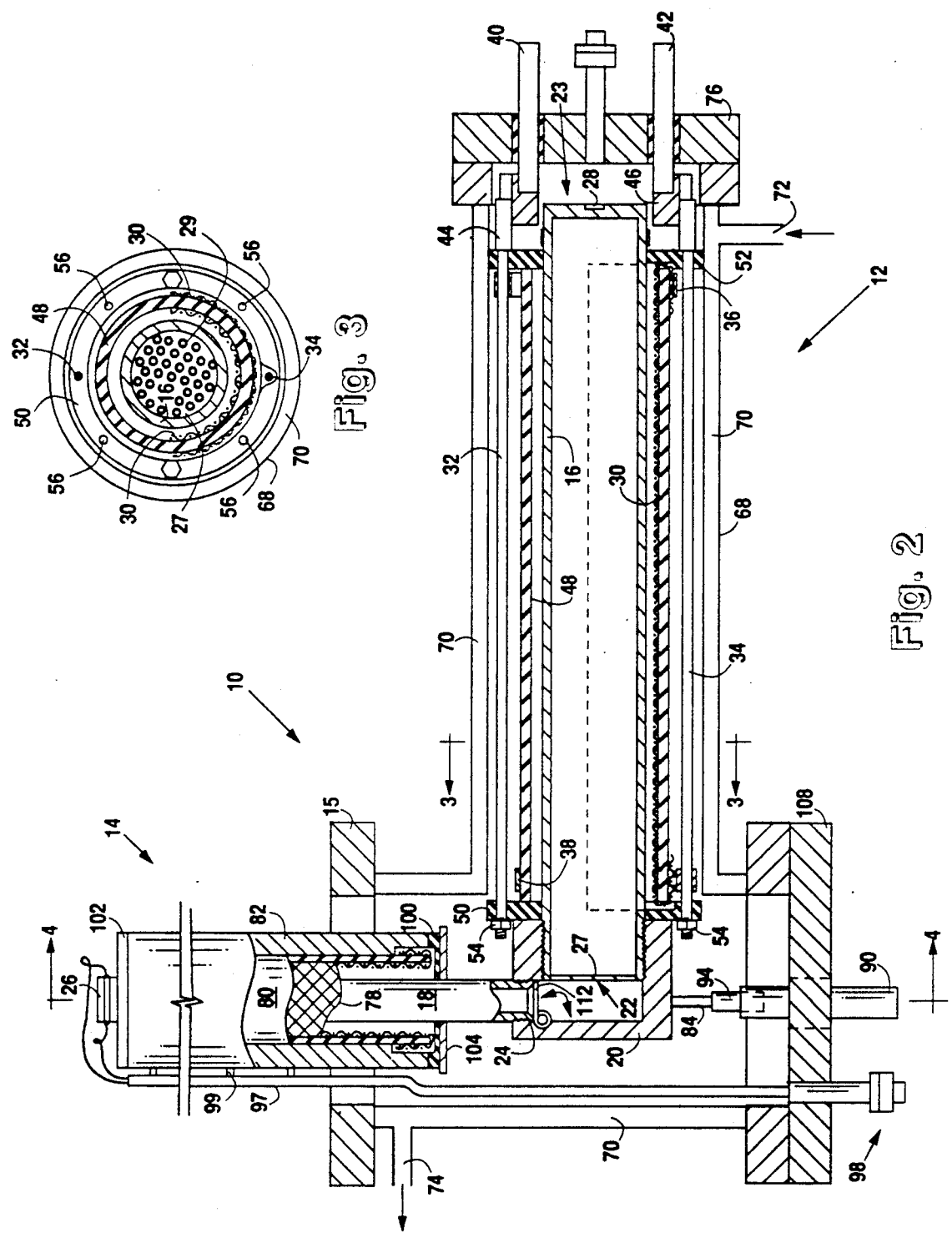

SUBLIMATING AND CRACKING APPARATUS

This is a continuation-in-part of copending application Ser. No. 241,578 filed on Sept. 8, 1988.

BACKGROUND OF THE INVENTION

1. Field of the Invention

This invention relates to sublimating and cracking apparatus. The apparatus contemplated by this invention can be used to produce a collimated beam of molecules or atoms from a solid source. Such a collimated beam is particularly useful as a source material in the field of molecular beam epitaxy ("MBE").

2. Description of the Related Art

MBE technology involves growing crystalline compounds on a substrate by directing beams of atoms or molecules onto the substrate in a vacuum environment.

Various devices have been developed to produce such atomic or molecular beams useful as a source material in MBE. Such devices typically include a furnace for sublimating a solid source to the gaseous phase (i.e. a "sublimator"). Some devices additionally include a second furnace section for cracking the sublimated molecules into smaller molecular species or to the atomic species (i.e. a "cracker"). For example, a solid tetrameric arsenic (As$_4$) source may be sublimated to tetrameric As$_4$ molecules, and then cracked to the trimeric, dimeric, or atomic species (i.e. As$_3$, As$_2$, or As, respectively).

One such device known to the Applicants uses a stainless steel sublimation section which is externally heated and a molybdenum tube cracking section which is heated along approximately two inches of its length. The sublimation and cracking sections are aligned on axis in relation to each other, with the discharge end of the sublimation section being restricted by a stainless steel aperture. It has been found that this device often produces less than acceptable levels of purity in the product molecular beam, at least partially due to the typically high temperatures required for sublimation tending to drive impurities out of the stainless steel surfaces into the source material, resulting in contamination.

Another known device uses a sublimation section in the form of an internally heated crucible (typically made of graphite or pyrolytic boron nitride) containing source material. A cracking section is provided using a construction having baffles to enhance cracking. The baffles are typically constructed of tantalum, molybdenum, or other refractory material. However, it has been found that these baffles tend to plug. Furthermore, the baffles tend to require high operating temperatures, and therefore high power inputs, to efficiently function.

Arsenic has proven to be a very useful source material in MBE technology for the growth of such semiconductor compounds as gallium arsenide (GaAs), aluminum gallium arsenide (AlGaAs) and indium gallium arsenide (InGaAs). Dimeric arsenic has been shown to have advantages over tetrameric arsenic in the growth of these compound semiconductors. For example, the sticking coefficient for arsenic increases from near zero for As$_4$ to 0.5 for As$_2$. This permits a lower arsenic to gallium flux ratio for arsenic stable growth of GaAs, thereby reducing consumption of source material. Furthermore, dimeric arsenic source material tends to reduce required background arsenic pressures in the MBE growth chamber, improve optical and electrical quality of the GaAs and AlGaAs products, and provide better morphology of AlGaAs layers.

Cracking cells have typically been fabricated from graphite, tantalum, molybdenum and pyrolytic boron nitride ("pBN"). However, the outgassing of graphite at high temperatures can result in an unintentional contamination of the epitaxial layers in the growth chamber. Tantalum and molybdenum are relatively easy to design and machine, but it has been suggested that tantalum might react with arsenic, as it does with phosphine. The use of a non-refractory material such as pBN is compatible with standard effusion cell technology, but the resulting inefficient cracking typically requires the use of refractory cracking baffles made from tantalum, molybdenum, rhenium or platinum. These baffles have a tendency to clog and extended operation of the cracker cell with high cracking efficiency often requires variable, high input power. Furthermore, low background carrier concentrations have been difficult to achieve with high temperature cracking cells.

Thus, it is an object of this invention to provide sublimating and cracking apparatus which addresses the disadvantages experienced by the above-described devices.

SUMMARY OF THE INVENTION

Broadly, the present invention provides a furnace for producing a collimated beam of molecules from a solid source including an elongated sublimating section and an elongated cracking section arranged off axis in relation to the elongated sublimating section. It is believed that the off axis arrangement contemplated by the present invention may provide at least three advantages. First, it optically isolates the discharge end of the cracking section (i.e., the end through which the molecular beam exits the cracker) from the solid source material disposed in the sublimator. This is believed to reduce the risk of particulate source material entering the MBE growth chamber with the molecular beam, thereby reducing flawing of MBE layers grown in the growth chamber. Furthermore, it protects the sublimator source material from contamination by impurities in the growth chamber.

Second, by providing an angular bend in the path of the sublimated gas, it is believed that cracking efficiency is enhanced. Applicants believe that the off axis geometry increases the number of collisions between the sublimated molecules and the interior surface of the cracker, thereby providing efficient cracking without the need for baffles in the cracking section. Baffles are believed to be undesirable in that they tend to plug or clog upon use due to condensation on the baffle surfaces. Furthermore, their location obstructs the vacuum pumping path of furnace interiors and the baffles thus tend to cause inefficient pumping. Elimination of baffles thus reduces clogging of the cracking tube and reduces heating and pumping power requirements as compared with conventional furnaces.

Third, the off axis arrangement allows the sublimating section to be maneuvered into a horizontal orientation regardless of the angle of the port of the MBE growth chamber into which the cracking section is inserted. That is, after the cracking section is inserted into a growth chamber source port, the furnace may be rotated about the axis of the cracking section to maneuver the sublimating section into a horizontal position. The furnace may then be fixed to the growth chamber for operation. By orienting the elongated sublimating section horizontally, a large amount of solid source material may be placed in the sublimator, without significant solid redistribution during heating. Furthermore, the source material may be evenly and efficiently heated from below the horizontal tube. In this configuration, the source material may present a large surface area for sublimation, thereby reducing required sublimator temperatures and facilitating a reproducible flux over extended time periods.

In a preferred embodiment of the present invention, a sublimating and cracking device is provided including an elongated sublimating tube and an elongated cracking tube. The sublimating tube has a discharge end through which gaseous molecules sublimated from a solid source disposed in the sublimating tube exit the tube. The cracking tube includes a charge end through which the sublimated molecules enter the cracking tube, and a discharge end where the cracked molecules exit the tube. Means are provided for interconnecting the discharge end of the sublimating tube and the charge end of the cracking tube. The sublimating tube is adapted to be oriented in a first direction, while the cracking tube is adapted to be oriented in a second direction off axis to the first direction. Means are provided for heating the sublimating tube and for heating the cracking tube.

In operation, a solid source is placed inside the sublimating tube. Preferably, the solid source is evenly distributed along the length of the tube. For example, solid tetrameric arsenic may be placed in the sublimating tube to be sublimated and cracked to, preferably, a beam of $As_2$ molecules. However, it should be understood that the device can be used to sublimate and crack other solid sources, e.g. phosphorous, antimony, and other materials useful in MBE technology. When the sublimating tube is charged with solid $As_4$, the material is sublimated to gaseous $As_4$ the sublimating tube and cracked in the cracking tube to, preferably, $As_2$.

Preferably, the sublimating tube, cracking tube, and interconnecting means (including the shutter when provided as described below) are made of a refractory material, e.g., molybdenum, rhenium, tantalum, tungsten, platinum, or pBN. In a more preferred embodiment particularly well adapted for cracking arsenic, these sections are made of molybdenum, rhenium, or tantalum. It is believed that such metals provide catalytic cracking of arsenic, thereby reducing cracking temperature requirements. Molybdenum is the most preferred at the present time.

In a preferred embodiment, the interconnecting means (e.g. an elbow connector) includes flux control means for controlling the flux of molecules from the sublimating tube to the cracking tube. The flux control means can take the form of any apparatus or arrangement allowing molecular flow to the cracking tube entrance passage to be partially or fully opened and closed, such as a shutter or valve.

The flux control means may provide several advantages. For example, it can allow total shut-down and rapid adjustment of flux (i.e. gas flow) from the sublimator, without the necessity of temperature change in the sublimator or cracking section. Minimizing the need for temperature adjustments may tend to reduce operation time and conserve sublimator material. Thus, the sublimator can remain at operating temperature at all times, thereby substantially reducing start-up time and permitting long term flux stability without source material depletion. Also, the flux control means can allow the operator to precisely regulate the source pressure in the MBE growth chamber at a desired level.

In a preferred embodiment, the flux control means comprises a valve, which may provide high precision in controlling the flux from the sublimator to cracker. Preferably, the valve comprises an annular (e.g. hollow cylindrical) plug connected at one end to a push rod for moving the plug between a fully open and a fully closed position. The term "push rod" is used to mean a shaft which is movable in a linear direction along its axis. In this preferred embodiment, the plug includes at least one longitudinal slot to provide gas flow communication from the sublimator to the cracker when the plug is in partially open positions (between fully open and closed). Thus, the longitudinal slot provides for decreasing flux from the sublimating tube to the cracking tube as the plug is moved from the fully open to the fully closed position.

Preferably, the valve plug includes a flange at the end which is connected to the push rod, to provide more effective shut-off of flux when the plug is in its completely closed position. Additionally, the peripheral wall of the plug may taper outwardly between the longitudinal slot and the end connected to the push rod, to provide a tight seal for the plug in the fully closed position.

In operation, the plug is inserted into the charge end of the cracking tube to close the valve. (Alternatively, the plug could be inserted into the discharge end of the sublimating tube, or into a fitting provided within the interconnecting means). As the plug is retracted, the slot is increasingly exposed, thereby providing increased flux.

The valve push rod is preferably rotatable about its longitudinal axis, so that impurities forming on the plug (or wall receiving the plug) can be ground away when the plug is in the fully closed position.

Preferably, the sublimating tube is adapted to be axially oriented in a substantially horizontal position for use. To achieve such a horizontal orientation, the operator may insert the cracking section into an appropriate entrance port of an MBE grown chamber and rotate the device until the sublimating tube (which is oriented off axis to the cracking tube) is positioned horizontally. The operator may then fix the device in the desired position on the growth chamber.

By orienting the sublimating tube in a substantially horizontal position, several advantages may be achieved. First, such a position allows for even distribution of solid source material along the entire length of the tube, thereby presenting a large surface sublimator. Depending upon the selected length and diameter of the sublimating tube, a large volume of source material can be initially placed in the sublimator, without significant risk of redistribution during firing. As should be appreciated, the greater the initial charge of source material, the less frequently the system must be shut down for recharging. Furthermore, horizontal orientation allows heating of the source material evenly and efficiently from below the sublimating tube, thereby minimizing outgassing of active gases.

In a preferred embodiment, the cracking tube is adapted to be connected substantially perpendicularly in relation to the sublimating tube. This may be achieved, for example, by providing a 90° elbow connector as the interconnecting means. Such elbows are commercially available. The perpendicular orientation facilitates horizontal orientation of the sublimating tube during use regardless of the angle of the cracking tube, and enhances collisions between gaseous molecules and the inner cracking tube walls.

Typically, much higher temperatures are required in the cracking section of a furnace than in the sublimating section. Accordingly, it is desirable to thermally isolate the cracking section from the sublimating section to prevent significant heat transfer between the two. Such a heat transfer would be undesirable in tending to increase the temperature of the sublimator, thereby increasing the sublimation rate to an undesired extent. It would further be undesirable in tending to decrease the temperature of the cracker, thereby reducing cracking efficiency.

To address these problems, the cracking tube provided in the present invention preferably includes a thermal sinking zone adjacent the charge end and a primary cracking zone distal from the charge end of the cracking tube. The operating temperature which may be achieved in the thermal sinking zone is substantially less than that in the primary cracking zone. The thermal sinking zone may thus act as a buffer minimizing heat transfer from the cracking section to the sublimating section.

The thermal sinking zone may be achieved, for example, by locating the cracking tube heating means to provide direct heat only to the primary cracking zone of the tube and not to the thermal sinking zone. The primary cracking zone may thereby be heated to a greater extent than the thermal sinking zone.

Preferably, the cracking and sublimating tube heating means are arranged to provide radial heating respectively to the cracking tube and sublimating tube. In a most preferred embodiment, this is achieved by providing the heating means as an expanded metal (e.g., tantalum) mesh filament surrounding the cracking tube and a similar filament surrounding the sublimating tube. Such a filament may be constructed by providing a sheet of metal, forming slits in the sheet, and stretching the metal sheet to form a mesh. The stretched sheet may then be rolled into a tubular filament to surround the cracking tube and sublimating tube. Radial heating may alternatively be provided by conventional extruded wire filaments wound through pBN washers. However, expanded metal filaments as described herein are preferred for several reasons. First, such filaments provide a distributed heat source, which minimizes temperature differences between the filaments and the tube to be heated. This is desirable since it reduces active gas generation (outgassing) and improves heating efficiency. Furthermore, such filaments are structurally self-supporting, (i.e., do not require perforated ceramic discs), thereby reducing cost and simplifying design.

When the sublimating tube is adapted to be oriented in a horizontal position during use, the sublimating tube heating means preferably comprises an expanded metal mesh filament to embrace only the lower portion of the sublimating tube, e.g., the lower half. Inasmuch as the solid source material will, due to gravitational forces, distribute in the lower portion of the sublimating tube, maximum heating efficiency is achieved when only the lower portion of the sublimating is directly heated. Furthermore, by reducing the surface area of the heating filament, off gas generation from non-refractory parts inside the furnace may be reduced. However, it should be understood that a filament surrounding the entire sublimating tube may also be used, and may be preferable in some applications by improving thermal response of the sublimating section.

Preferably, an insulating tube surrounds each expanded metal mesh filament. These insulating tubes provide electrical insulation between the exterior and interior of the furnace device. Furthermore, the insulating tubes may provide physical support for the expanded metal mesh filaments. The insulating tube is preferably made of pBN.

In a preferred embodiment, the device further includes a heat shield arrangement surrounding the cracking tube heating means. This arrangement preferably comprises a plurality of radially spaced heat shields surrounding the cracking tube heating means. For example, the heat shields may take the form of coaxial tubes, the heat shield arrangement including means for spacing the coaxial tubes. The heat shields and spacing means are preferably made of tantalum foil. By providing space between individual shields, thermal isolation between the cracker tube and outermost surface of the cracker section during operation is enhanced.

When the cracking tube includes a thermal sinking zone adjacent its charge end, the heat shield arrangement preferably surrounds only the primary cracking zone, leaving the thermal sinking zone unshielded. This serves to hinder heat transfer from the cracking tube to the sublimating zone.

In a preferred embodiment, the device further includes control means for monitoring and regulating the temperature of the cracking tube and/or sublimating tube. For example, a thermocouple may be attached to the interior or exterior surface of each tube. Applicants have found that the most accurate cracking tube temperature readings are obtained by attaching the thermocouple leads proximate the axial midpoint of the cracking tube. However, adequate readings are also obtained by locating the leads proximate the charge or discharge end of the cracking tube.

The cracking tube may be threaded at its charge end for coupling to the interconnecting means. Similarly, the sublimating tube may be threaded at its discharge end. This allows convenient removal of the sublimating tube for reloading of source material upon depletion.

Since MBE growth is typically operated in a vacuum environment, the device preferably includes means for vacuum pumping the interior of the device. These means generally comprise interior holes in the furnace providing gas flow communication between the interior spaces of the furnace and a vacuum pump exterior to the furnace. The term "means for vacuum pumping" as used herein does not include the actual vacuum pump since such is usually provided as part of a conventional MBE growth chamber.

In a preferred embodiment, the device also includes cooling means to surround the interconnecting means and the sublimating tube heating means. Cooling of the furnace is desirable for minimizing contamination due to outgassing from non-refractory surfaces in the furnace. Cooling the outer surfaces of the furnace can also be important for safety reasons. The cooling means may comprise means for circulating a coolant fluid in surrounding relationship to the interconnecting means and sublimating tube heating means. For example, the fluid circulating means may take the form of a jacket or coil to surround the interconnecting means and the sublimating tube heating means. Cooling fluid may then be circulated through the jacket or coil.

The device may include a housing enclosing the sublimating tube, interconnecting means, and sublimating tube heating means. The housing may be made of any suitable material, for example, stainless steel.

BRIEF DESCRIPTION OF THE DRAWINGS

FIG. 2 is a partially fragmentary, sectional side view particularly illustrating the sublimating section of the furnace shown in FIG. 1.

FIG. 3 is a sectional view at the position indicated in FIG. 2.

DETAILED DESCRIPTION OF THE PREFERRED EMBODIMENTS

Figures 1, 5:
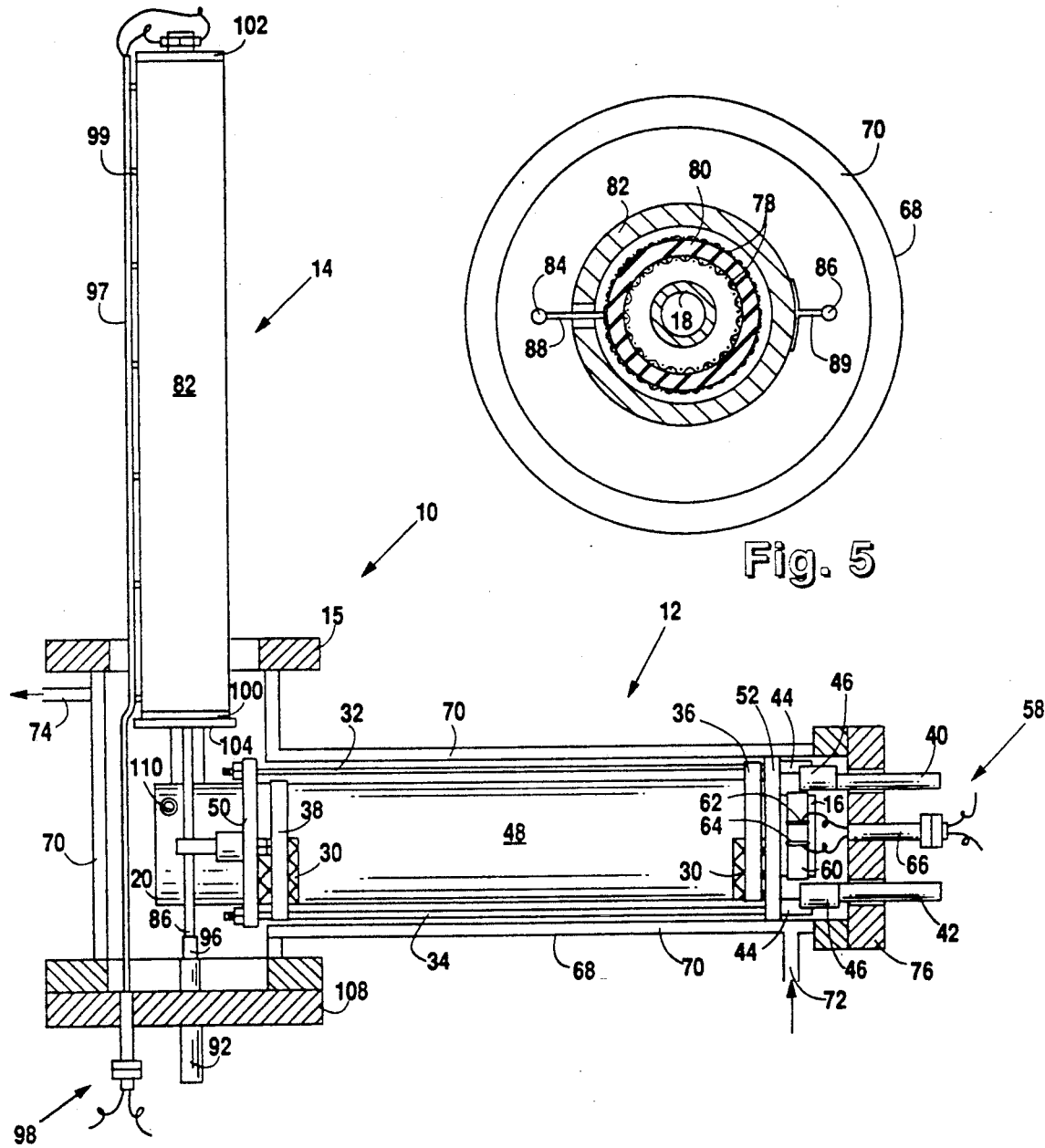
FIG. 1 is a partially sectional side view of a preferred embodiment of a furnace in accordance with the present invention.
FIG. 5 is a sectional view at the position indicated in FIG. 4.

FIG. 1 shows the preferred embodiment, including a furnace 10 having an elongated sublimating section 12 and cracking section 14. The cracking section 14 may be inserted into a source port of a conventional MBE growth chamber (not shown) and the furnace 10 fixed in vacuum light relation to the growth chamber by flange 15. As shown in the figures, the sublimating section 12 is preferably oriented in a substantially horizontal position during use, while the cracking section 14 is oriented off axis to the sublimating section 12. The preferred angular relation between the two sections is 90°.

Referring particularly to FIG. 2, the furnace 10 includes a sublimating tube 16, a cracking tube 18, and an elbow connector 20 for connecting the tubes 16 and 18. The sublimating tube 16 includes a discharge end 22 which is threaded for mating with elbow 20, and a closed end 23 opposing the discharge end 22. Similarly, the charge end 24 of the cracking tube 18 is threaded for mating with the elbow 20. The threads preferably have large tolerances to minimize thermal coupling between the refractory parts. In use, the sublimating tube 16 and cracking tube 18 may thus be oriented perpendicularly to each other. The cracking tube 18 also includes a discharge end 26 through which the cracked product beam exits.

Horizontal positioning of the sublimating tube 16 during use provides for containment of solid source material so as to limit material redistribution during sublimation. In operation, such a source material is placed in the sublimating tube 16 and preferably distributed evenly along the length of the tube. The upper surface of the source material thus provides a large sublimator surface area, facilitating a reproducible flux.

During operation, it is desirable that source material not fall into the elbow portion 20 of the furnace 10. To address this, removable baffle 27 is preferably provided to snugly fit inside the sublimating tube 15 proximate its discharge end 22. As best shown in FIG. 3, the baffle 27 includes holes 29, the holes preferably being sized to block passage of solid source material but allow flow of sublimated gas. The baffle 27 thus acts as a sieve to contain the solid source material in the sublimating tube but allow flow of sublimated source molecules to the cracking section. In operation, source material may be charged in the sublimating tube 16 and the baffle 27 inserted to prevent solid source material from falling into the elbow portion of the furnace 10.

Alternatively, one could prevent source material from falling into the elbow 20 during charging and operation without the use of a baffle 27 by placing source material inside sublimating tube 16 and inserting the cracking section 14 into a growth chamber entrance port in such a way that the closed end 23 of the sublimating tube is pointed generally downward. This could tend to cause the solid source material to fall towards the closed end 23 of the tube 16. Then, the furnace could be rotated about the axis of the cracking section 14 to pull the sublimating section 12 into a generally horizontal position. By such maneuvering, the solid source material could be retained in the sublimating tube 16 without the material falling into the elbow 20. Of course, during operation, there would be a greater risk of solid material falling out of the open end 22 of the tube 16 than if a retaining baffle is provided. Thus, provision of the baffle 27 is preferred.

In the preferred embodiment, the sublimating tube 16 is made of molybdenum and is about ten inches in length, having an outer diameter of about 1.5 inches and wall thickness of about 0.015 inches. A left handed axial bottomed hole 28 may be provided in its closed end 23 for installation of a removable handle (not shown) to simplify removal and installation of the sublimating tube 16.

Means are provided for heating the sublimating tube 16 to a desired sublimating temperature (e.g. 200° C.-250° C. for arsenic, preferably 235° C.). In the preferred embodiment shown, these heating means include an expanded tantalum mesh filament 30 located to embrace only the lower half of the sublimating tube 16. Such a filament can produce sublimation temperatures above 500° C. The filament 30 may alternatively embrace the entire circumference of the tube 16, which may improve thermal response inside the sublimating tube. However, such an arrangement may also increase active gas generation outside the sublimating tube.

Upon passage of electrical current therethrough, the filament 30 is operable to provide radial heating to the lower half of the tube 16. By directly heating only the lower portion of the tube 16, heating efficiency may be enhanced, carbon monoxide outgassing may be minimized, and thermal insulation requirements may be reduced.

The Applicants have found that optimum resistivity at high operating temperatures is achieved when the filaments (both the sublimator filament and cracker filament) have the following specifications: about 0.004 inches foil thickness; about 0.005 inches strand thickness; about 0.125 inches long axis of the individual mesh openings (diamond-shaped), and about 0.065 inches short axis of individual mesh openings. Such mesh is commercially available from EXMET, INC.

Means for delivering and returning electrical current to and from the filament 30 are provided in the form of electrical buses 32 and 34, preferably made of molybdenum. The filament 30 is electrically connected to supply bus 32 proximate the closed end 23 of the tube 16 via a ribbon connector 36. Similarly, filament 30 is electrically connected to return bus 34 proximate the open discharge end 22 of the tube 16 via a second ribbon connector 38. The ribbon connectors 36 and 38 are preferably made of tantalum. The buses 32 and 34 are in turn connected to electrical supply 40 and return 42 assemblies respectively via intermediate electrical connectors 44 and 46. Electricity may be supplied to the furnace from a conventional AC or DC power source.

Sublimating section 12 further includes an insulating tube 48 preferably made of alumina. The insulating tube 48 surrounds the filament 30 to provide support and electrical isolation.

Structural support for the sublimating section 12 is further provided in the preferred embodiment by a pair of opposing annular discs 50 and 52, preferably made of alumina. The inner diameter of the discs 50 and 52 are cooperatively dimensioned to receive and align sublimating tube 16 therethrough. Each disc may also include an annular inner groove to receive the ends of the insulating tube 48. By providing such a groove, filament 30 may conveniently be folded between each disc 50, 52 and insulating tube 48 (see FIG. 2) and back over the lower and outer diameter of insulating tube 48 (see FIG. 1). Electrical ribbon connectors 36 and 38 may then be conveniently spot welded to the folded back portion of filament 30.

As best shown in FIG. 3, ceramic disc 50 (as well a 52) may include upper and lower peripheral holes through which electrical buses 32 and 34 are fed. Referring back to FIG. 2, the bus rods 32 and 34 may be threaded at one end for acceptance of nuts 54, thereby fixing the buses 32 and 34 relative to ceramic disc 50. Ceramic discs 50 and 52 may further include peripheral holes 56 for allowing vacuum pumping of the interior of the furnace.

The preferred embodiment also includes a thermocouple assembly 58 for monitoring and controlling the temperature of the sublimating tube 16. Referring to FIG. 1, a collector ribbon 60 (preferably tantalum) surrounds the sublimating tube 16 proximate its closed end. The negative and positive thermocouple leads 62 and 64 are electrically connected by spot welding to collector ribbon 60 and thermocouple wires pass through thermocouple feed through assembly 66 to process control means (not shown).

The preferred embodiment includes a weldment or housing 68 generally enclosing the sublimating section 12 and elbow 20. The housing 68, preferably made of stainless steel, comprises a T-shaped member having hollow external walls to provide a jacket passage 70 through which a cooling fluid may be circulated. Thus, a coolant may be provided to enter nozzle 72 and exit 74, thereby cooling the exterior surface of the furnace device 10.

As shown in FIGS. 1 and 2, the end of housing 68 proximate the closed end 23 of the sublimating tube 16 is coupled with a rotatable feed through flange 76 having appropriate holes for electrical and thermocouple access to the sublimating tube 16.

The cracking section 14 of the furnace 10 will now be described in detail. As can be seen from FIG. 2, the cracking section includes a cracking tube 18 arranged off axis (preferably perpendicularly) to the sublimating tube 16. The cracking tube 18 is preferably made of molybdenum and is about 12 inches in length with 0.5 inch outer diameter, and is threaded at its charge end 24 for mating with the elbow connector 20.

Figure 4:
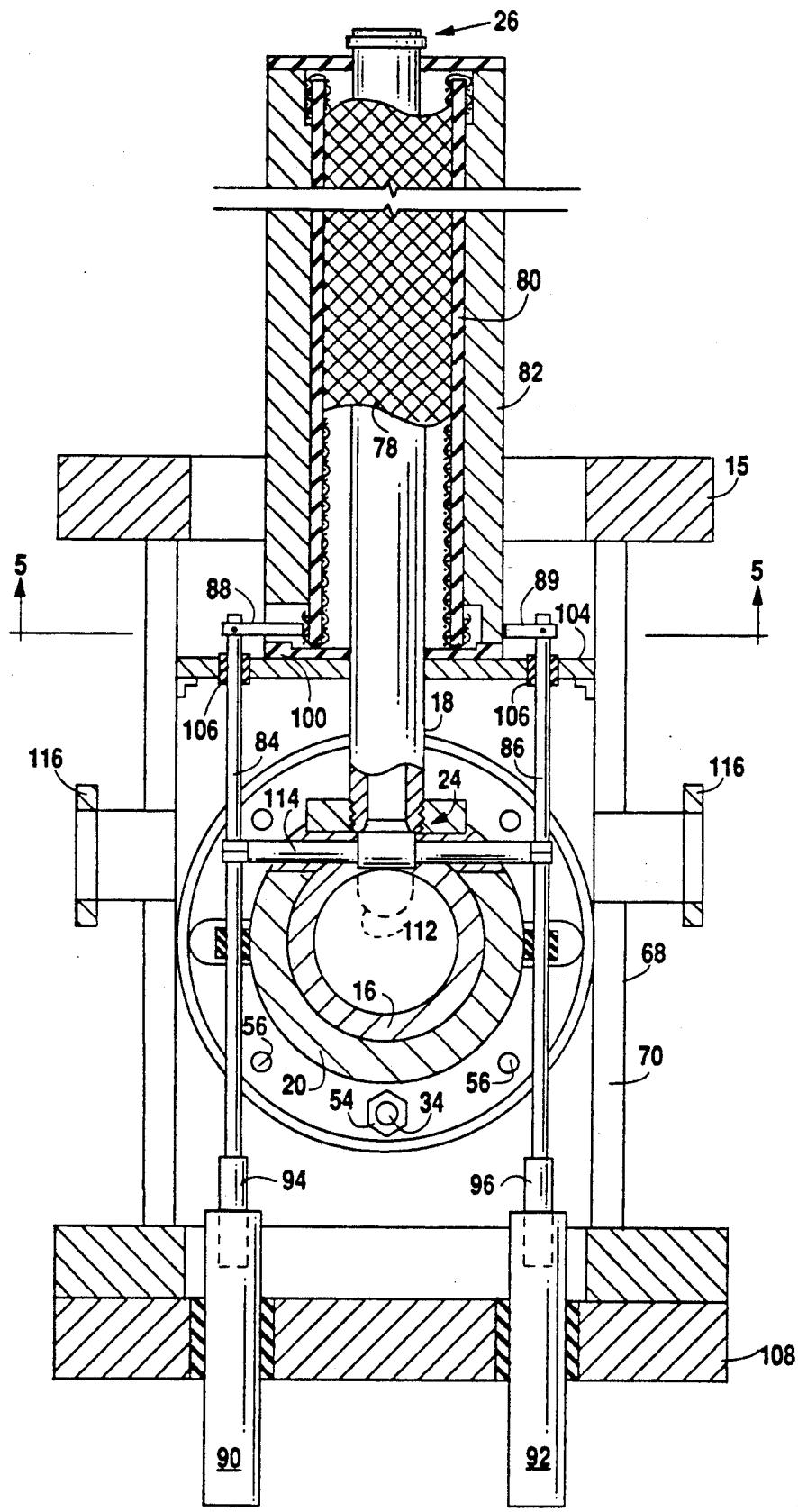
FIG. 4 is a sectional view at the position indicated in FIG. 2.
Figure 6:
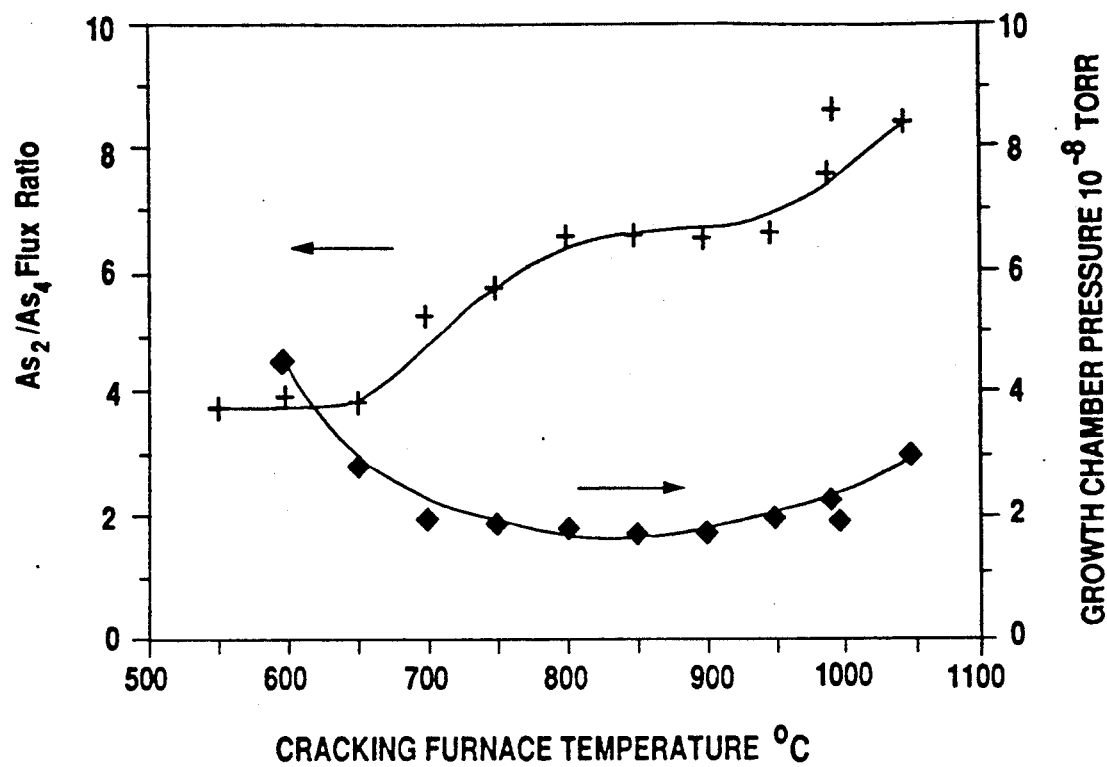
FIG. 6 is a plot of experimental data showing $As_2$/$As_4$ flux ratio as a function of cracking furnace temperature.
Figure 7:
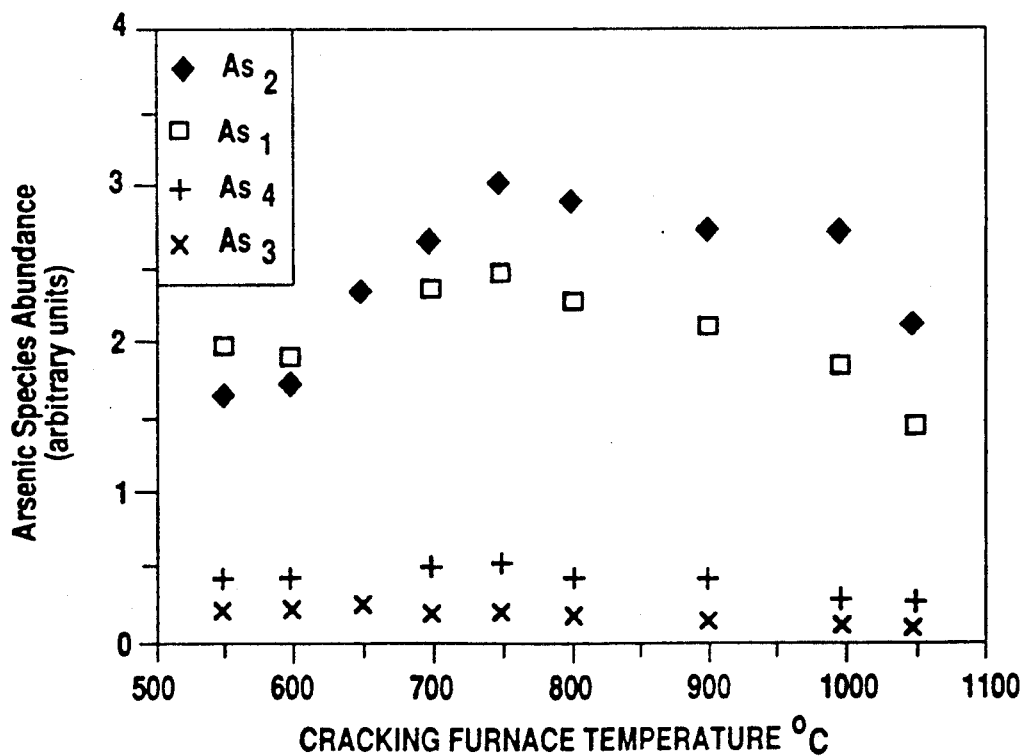
FIG. 7 is a plot of experimental data showing arsenic species abundance as a function of cracking furnace temperature.

Referring particularly to FIG. 4, the cracking tube 18 is surrounded along most of its length by an expanded tantalum mesh filament 78. Upon passage of an electrical current therethrough, the filament 78 provides radial heating to the cracking tube 18. The filament 78 may be operable to heat the tube 18 to cracking temperatures of above 1200° C. However, due to the off axis arrangement, upon appropriate selection of furnace materials high efficiency cracking may be obtained at cracking tube temperatures of between about 750° and 1050° C.

In the preferred embodiment as best shown in FIGS. 2 and 4, the filament 78 is surrounded and supported by an electrically insulating tube 80, preferably made of pBN. The insulating tube 80 is in turn surrounded by a heat shield arrangement 82. The heat shield arrangement 82 preferably comprises a plurality of radially spaced, coaxial tubes made of tantalum foil. These heat shield tubes are spaced from one another by tantalum ribbon spacers located between the individual heat shield tubes. (Due to the thinness of the individual heat shield walls, heat shield arrangement 82 is shown schematically in the figures, and individual shields are not shown).

Since pBN is a relatively expensive material, insulating tube 80 may alternatively be replaced with a plurality of pBN washers spaced along the length of the tube, and a short pBN sleeve positioned at each end of the cracking tube. These sleeves and washers should be placed in the same position as insulating tube 80, i.e. between the filament 78 and heat shielded arrangement 82, thereby providing support for the filament. The reduction of pBN as provided by this embodiment may be desirable to reduce outgassing and cost of the filament assembly.

The heat shield arrangement 82 preferably comprises seven coaxial tubes of tantalum foil. The inner shields may be thinner than the outer shields. Thus, the inner three shields may be for example 0.001 inches while the remaining shields may be 0.002 inches thick.

Means for delivering and returning an electrical current to and from the filament 78 are provided in the form of electrical supply and return buses 84 and 86, preferably comprising molybdenum rods. Referring particularly to FIGS. 4 and 5, supply bus 84 is electrically connected via a tantalum ribbon connector 88 to the filament 78, which is folded at its lower end back over the insulating tube 80. Slits are provided at the lower end of the filament 78 to allow it to be so folded. Furthermore, the lower ends of the inner shields of arrangement 82 terminate above disc 100 to provide a cavity accommodating the folded back portion of filament 78 (see FIG. 2). A hole in the heat shield arrangement 82 provides for passage of the ribbon connector 88 from the supply bus 84 to the filament 78.

The heat shield arrangement 82 is used in the preferred embodiment as a return loop for electrical current passing through the filament 78. This is accomplished by electrically connecting the upper end of filament 78 to the heat shield arrangement 82, and electrically connecting the lower end of the heat shield arrangement to the return bus 86. In more detail, the upper end of filament 78 is folded back over the insulating tube 80, and electrically connected to the innermost shield of arrangement 82, as shown in FIG. 4. The lower end of the outermost shield of arrangement 82 is in turn electrically connected to return bus 86 via another tantalum ribbon connector 89 (see FIGS. 4 and 5). Electrical buses 84 and 86 are connected at their lower ends to electrical supply 90 and return 92 assemblies via intermediate electrical connectors 94 and 96.

By locating the lower ends of the filament 78 and heat shield arrangement 82 a selected distance above the charge end 24 of the cracking tube 18, the cracking tube is conveniently provided with a thermal sinking zone adjacent its charge end. Primary cracking will generally occur in the zone of the tube 18 which is surrounded by the filament 78 and heat shields 82, since that zone is directly heated during operation. The length of the tube 18 between its lower end 24 and lower end of the filament 78, being unshielded and receiving no direct radial heating, has a substantially lower operating temperature than the primary cracking zone, and thus provides a zone of thermal sinking between the cracking section 14 and sublimating section 12. This may effectively minimize undesired heat transfer between the two sections.

Thermocouple means are provided for monitoring and regulating the temperature of the cracking tube 18. A thermocouple assembly 98 is provided being substantially similar to sublimator thermocouple 58 hereinabove described. The cracker thermocouple leads may be conveniently connected to the cracking tube 18 proximate its discharge end 26 as illustrated, although more accurate temperature readings may be obtainable by connecting the leads to the tube proximate its axial midpoint. The leads might also be connected to the cracking tube 18 proximate its charge end 24, e.g., by placement above or below support plate 104. An alumina ceramic sleeve 97 having two separate longitudinal bores may be provided to protect the thermocouple leads from electrical contact with each other and with the heat shield arrangement 82. The sleeve 97 may be supported and spaced from the heat shield arrangement 82 via tantalum wire spacers 99.

Structural support and alignment for the cracking section 14 is provided in part by a pair of support discs 100 and 102 abutting each end of heat shield arrangement 82. Disc 102 includes an axial hole appropriately sized to accommodate the discharge end 26 of the cracking tube 18 therethrough. Disc 100 has a similar axial hole to accommodate the tube 18. Discs 100 and 102 are preferably made of pBN ceramic.

Further support and alignment may be provided by a support plate 104, which is fixed to the interior surface of housing 68 (as shown in FIG. 4). Plate 104 includes an axial hole and peripheral holes for aligning and securing the cracking tube 18 and buses 84 and 86. Preferably, plate 104 is made of tantalum to provide thermal conductivity from the primary cracking zone of the cracking tube 16 to the cooling jacket 70. The buses 84 and 86 may be electrically isolated from tantalum plate 104 by providing pBN shoulder washers 106 or other electrical insulation where the buses pass through the disc. As can be seen from FIGS. 1 and 2, the plate 104 is shaped in such a manner as to allow space between two opposing portions of its outer edge and the inner surface of housing 68, thereby providing access for thermocouple leads and for vacuum pumping of the furnace weldment interior.

A rotatable feed through flange 108 is coupled to the housing 68 having appropriate holes for electrical and thermocouple access to the cracking tube 18. The hole in flange 15 through which the cracking section 14 extends has a larger diameter than the outermost shield 82, thereby allowing vacuum pumping access to the interior of the furnace housing 68.

The preferred embodiment of the elbow connector 20 will now be described. Elbow 20 is provided with female threads to accommodate and interconnect sublimating and cracking tubes 16 and 18, and is preferably made of molybdenum. The female threads of elbow 20 may be coated with pBN powder to reduce the risk of seizer between the tubes 16 and 18 and elbow 20 due to high operating temperatures. Coating may conveniently be applied by mixing pBN powder and water to a slurry, painting the female threads with such slurry, and allowing them to dry.

Elbow 20 is provided with a shutter mechanism 110 for selectively opening, partially closing, and fully closing the charge end 24 of cracking tube 18. The shutter mechanism includes a shutter plate 112 mounted to a rotatable shaft 114. By rotation of the shaft 114, the shutter plate 112 may be selectively rotated from its fully closed position as shown in FIG. 2 to its fully open position as illustrated in FIG. 5, or to any position there between. By provision of such a shutter assembly, flux from the sublimating tube 16 to the cracking tube 18 can be precisely controlled, and when closed, the sublimating section 12 can remain at operating temperatures continuously to minimize long start-up time and to facilitate long term flux stability without source material depletion.

Shutter shaft 114 is preferably dimensioned so that it may be inserted and removed along with the sublimating section components through housing 68. Means for rotating the shaft may be inserted through one (or both) mini-flanges 116 and attached to the end of shaft 114. Each end of shaft 114 should be supplied with a nut or other means for attachment with such rotating means. Miniflanges 116 thus provide physical access to the shaft 114, and also provide a seal to maintain vacuum integrity inside the furnace 10.

Figure 8:
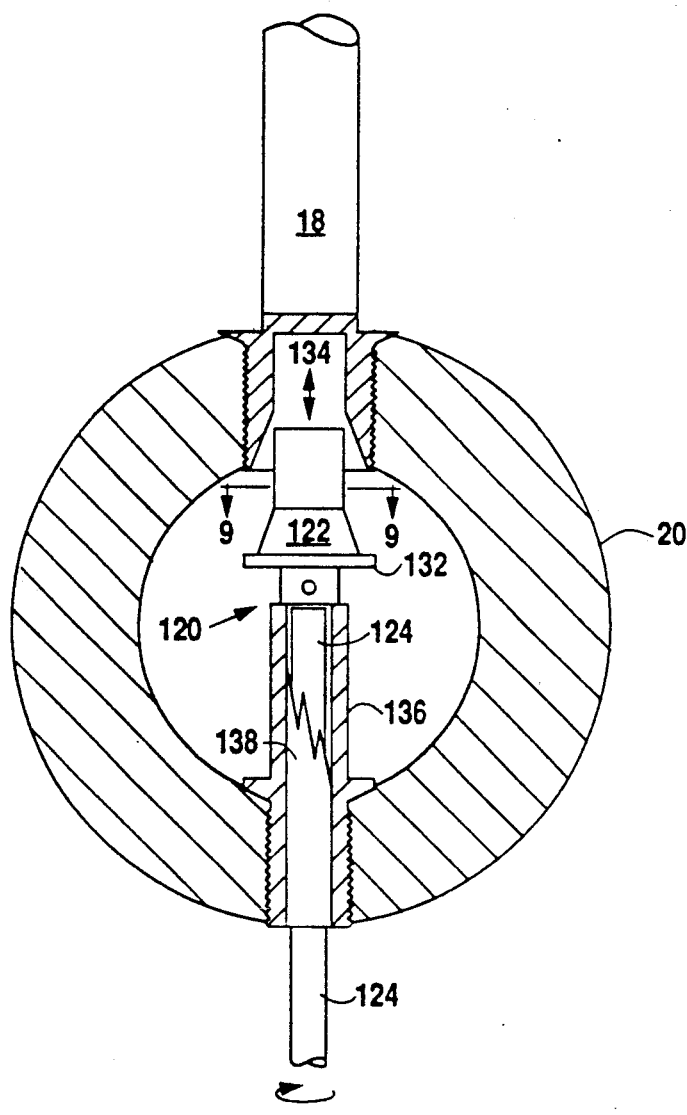
FIG. 8 is a sectional view of an interconnecting elbow similar to that depicted in FIGS. 1-5, but replacing the shutter with a valve.
Figure 9:
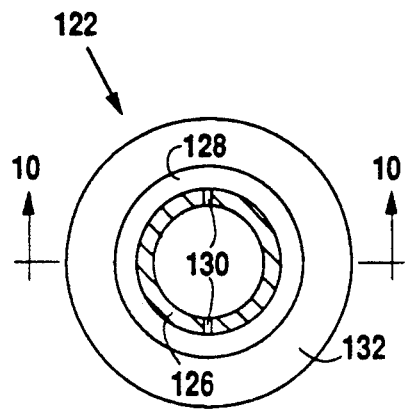
FIG. 9 is a sectional view of the valve plug taken at the position shown in FIG. 8.
Figure 10:
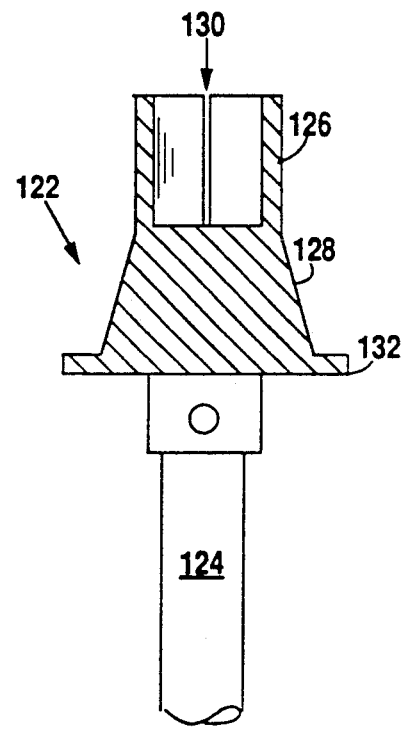
FIG. 10 is a sectional view of the valve taken at the position shown in FIG. 9.

The shutter described in relation with FIGS. 1-5 may be replaced with a valve assembly as an alternative flux control mechanism. A preferred valve assembly is illustrated in FIGS. 8-10. As best shown in FIG. 8, the valve 120 comprises a plug 122 connected at its lower end to a push rod 124. The push rod 124 extends through elbow 20 to mechanical means (not shown) for both linearly and rotationally moving the push rod, thereby providing the ability to insert, retract, and rotate the plug 122. A machine having precise resolution of linear motion should be used, so as to allow precise control in attending flux. A Del Seal (brand) BRLM Series Combination Rotary and Linear Feedthrough from MDC Vacuum Products Corp. of Hayward, Calif. (or similar products from other manufacturers) is acceptable, providing approximately 0.001 inch linear resolution.

Referring now to FIGS. 9 and 10, it can be seen that the plug 122 includes an annular upper section 126 and a solid lower section 128. The annular section 126 includes two longitudinal slots 130 which allow molecular flow from the exterior of the plug 122 (i.e. the sublimator region) through the plug and into the cracking section. The plug 122 also includes a flange 132 at its lower end. The lower section 128 has walls which taper outwardly from upper section 126 to flange 132.

The operation of the valve 120 will now be described. FIG. 8 shows the valve 120 in its fully open position, the plug 122 being fully retracted by push rod 124. In this position, maximum flux from the subliminator to cracker is achieved.

Flux can be decreased by linearly moving push rod 124 upwards, thereby pushing plug 122 into the charge end of cracker tube 18 which is cooperatively configured at threaded end 134 to accept the plug. As the plug 122 is moved upwards, the wall of upper section 126 will contact the interior wall of charge end 134. However, molecular flow is still allowed through slots 130. As the plug 122 continues to move upward, the exposed portion of the slots 130 becomes shorter and shorter, thus decreasing flux therethrough. When the plug 122 is fully inserted into charge end 134, flux is essentially shut off, as lower section 128 and flange 132 come into contact with the charge end and shut off gas flow communication to the cracking tube 18.

Since linear resolution of the plug on the order of 0.001 inch is achievable with commercially available equipment, the flux can be precisely controlled. Typically, the desired cross-sectional area of the exposed slot may be on the order of less than 0.1 square millimeter.

In the fully closed position, push rod 124 may be rotated about its axis, thereby rotating plug 122 within charge end 134. In this way, impurities (such as carbon deposits) which may form on the plug 122 or charge end 134 during use may be ground away.

Referring to FIG. 8, a sleeve 136, which houses an insulating bushing 138, is threaded into elbow 20. The outer diameter of the push rod 124 should be closely dimensioned with the inner diameter of bushing 138 to provide a snug fit, and thus reduce source material leakage and vacuum loss through the valve assembly.

Preferably, the valve 120 and sleeve 136 are made of molybdenum and the bushing 138 is made of pBN ceramic.

It should be appreciated that the valve assembly can be arranged so that the plug is inserted and retracted into the cracking tube (as shown in FIG. 8), or could alternatively be inserted and retracted into the discharge end of the sublimator, or some other fitting associated with the elbow. However, inserting the plug into the cracking tube (as illustrated in FIG. 8) is the preferred arrangement, since it keeps the plug and grooves in close proximity to the high temperature cracker, thereby reducing the likelihood of source material condensing thereon.

EXAMPLES

The experimental studies described below were carried out in a Varian GEN II MBE system. The arsenic cracking furnace and a conventional $As_4$ source were installed in source ports in the growth chamber. The sublimator section was loaded with 200 cc of polycrystalline arsenic supplied by Johnson Matthey Corporation. To study the arsenic cracking patterns, mass spectra were taken using a UTI model 100C residual gas analyzer, installed in the conventional configuration (i.e., in the fringe of the direct beam) and no additional system modification was made. An emission current of 2.0 mA, a focus setting of $-30$ V, an electron energy of 70 eV, and an ion energy of 15 eV were employed and mass spectra were corrected for ionization efficiency, multiplier gain and quadruple transmission sensitivity to individual species. Cracking furnace temperature measurements were made using an optical pyrometer. All measurements were made at a constant sublimator setting corresponding to an arsenic flux of $1 \times 10^{-5}$ Torr.

FIG. 2 shows a plot of the $As_2/As_4$ beam flux ratio obtained from the cracking furnace as a function of cracking tube temperature. The growth chamber pressure as measured by an ionization gauge is also shown in FIG. 2. The onset of cracking at 650° C. was indicated by a drop in the chamber pressure, and a high efficiency cracking was obtained from 750°–1050° C. Beyond 1050° C. the cracking efficiency decreased slightly and the growth chamber pressure slowly increased.

Abundance of the four arsenic species as a function of cracking furnace temperature is shown in FIG. 3. At a cracking furnace temperature of 650° C., the $As_1$ and $As_2$ fluxes began to rise sharply. Since no modulated beam mass spectrometry measurements of the emitted species were made, and due to the large sticking coefficient of the dimer and atomic arsenic species, it should be noted that beyond 750° C. the $As_2$ and $As_1$ fluxes may actually have been increasing. Hence, the data presented herein may underestimate the cracking efficiency of the source.

Silicon doped GaAs layers were grown with $As_2$ from the cracking source, and with $As_4$ from the sublimator while maintaining the cracking section at an idle temperature. The samples were grown at 600° C. and 650° C., and variable temperature Hall measurements, photoluminescence, and DLTS measurements were made to characterize the grown material. In-Sn ohmic contacts in a Van Der Pauw configuration were employed to make Hall measurements. Donor and acceptor concentrations were then calculated. For n-type GaAs layers doped $1-2 \times 10^{16} cm^{-3}$, the samples grown with $As_2$ had a compensation ratio, $N_A/N_D$, ranging from 0.25–0.28. GaAs samples with the same doping grown using $As_4$ exhibited a higher compensation ratio of 0.35–0.40. The reduced compensation obtained using $As_2$ would seem to suggest reduced arsenic vacancy concentrations in these samples due to the enhanced $As_2$ sticking coefficient. Photoluminescence spectra of these samples taken at 4K with a laser power density of 1 W/cm$^2$ showed comparable luminescence intensity between the $As_2$ and $As_4$ grown layers. However, the luminescence intensity for the carbon-related acceptor peak was higher in the $As_4$ grown samples.

Preliminary DLTS studies on these samples showed marked difference in trap concentrations between the $As_2$ and $As_4$ grown samples, depending upon growth temperature and arsenic overpressure employed. The DLTS samples were prepared with aluminum Schottky barriers and indium-tin ohmic contacts. Linear $1/C^2$ versus V capacitance-voltage profiles showed good agreement with the doping concentrations obtained from Hall measurements, with an extrapolated barrier height of 0.8 V, indicating good sample homogeneity. For samples grown at 650° C., the trap M4 was present in the $As_4$ grown samples at a concentration of $5 \times 10^{13} cm^{-3}$, while in the $As_2$ grown samples the M4 trap was suppressed. The traps M1 and M3 were present in both samples; the concentration of these traps in the $As_4$ grown samples ($1.2 \times 10^{13} cm^{-3}$), however, was reduced by almost an order of magnitude to $1.6 \times 10^{12} cm^{-3}$ in the $As_2$ samples. No M5-M6 signal was detected in the $As_4$ grown samples, but this trap was present in the $As_2$ grown samples at a concentration of $3 \times 10^{13} cm^{-3}$.

Using the $As_2$ source described herein, $GaAs/Al_{0.3}Ga_{0.7}As$ HEMT structures have been grown with 77 K mobilities in excess of 100,000 $cm^2/V$-s, and pseudomorphic $In_{0.15}Ga_{0.85}As/Al_{0.15}Ga_{0.85}As$ HEMTs with mobilities greater than 30,000 $cm^2/V$-s. Double barrier GaAs/AlAs resonant tunneling diodes have exhibited room temperature peak-to-valley current ratios between 2-3:1 and current densities around $3 \times 10^4$ $A/cm^2$. The electrical and optical properties of both bulk GaAs and GaAs/AlGaAs heterostructure devices have indicated low background concentrations with negligible contamination of the epitaxial layers.

The instant invention has been disclosed in connection with specific embodiments. However, it will be apparent to those skilled in the art that variations from the illustrated embodiments may be undertaken. For example, the exterior housing of the furnace device could be T shaped as shown in the illustrated embodiment, or could be formed by joining two or more weldment pieces. Thus, an elbow weldment section could be provided to surround the elbow connector, while a straight nipple weldment section could be joined to the elbow section to surround the remaining length of the sublimator section. In such a variation, cracker and sublimator thermocouple and electrical supply and return assemblies could be located at the nipple end proximate the closed end of the sublimating tube. The cracker thermocouple and electrical buses would then travel the length of the sublimator section for connection to the cracker assembly. These and other variations are within the spirit and scope of the present invention.

What is claimed is:

1. A high vacuum furnace capable of use in generating a collimated beam for use in molecular beam epitaxy comprising a sublimating section connected with a cracking section and means for vacuum pumping said sections substantially to a vacuum environment, and further comprising a valve between said sections for controlling molecular flux, the valve comprising an annular plug connected at one end to a push rod for moving the plug between a fully open position and a fully closed position, the plug including at least one longitudinal slot for decreasing molecular flow from the sublimating section to the cracking section as the plug is moved from the fully open position to the fully closed position.

2. The furnace of claim 1, wherein the plug is inserted and retracted into the cracking section during use.

3. The furnace of claim 1, wherein the plug is inserted and retracted into the sublimating section during use.

4. The furnace of claim 1, wherein the plug is inserted into a fitting provided within means for interconnecting the sublimating and cracking sections.

5. The furnace of claim 1, wherein the plug includes a flange at the end connected to the push rod.

6. The furnace of claim 1, wherein the plug includes an outwardly tapering wall between the slot and the end connected to the push rod.

7. The furnace of claim 1 or 2, wherein the push rod is rotatable about its longitudinal axis.

* * * * *